(12) United States Patent
Sawdai et al.

(10) Patent No.: US 8,334,550 B1
(45) Date of Patent: Dec. 18, 2012

(54) UNIPOLAR DIODE WITH LOW TURN-ON VOLTAGE

(75) Inventors: Donald J. Sawdai, Redondo Beach, CA (US); Kwok K. Loi, Cerritos, CA (US); Vesna Radisic, Manhattan Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 13/156,525

(22) Filed: Jun. 9, 2011

(51) Int. Cl.
    *H01L 29/66* (2006.01)
(52) U.S. Cl. ............ 257/104; 257/9; 257/471; 257/607; 257/E29.332; 438/979
(58) Field of Classification Search ............ 257/9, 104, 257/471, 607, E29.226, E29.327, E29.328, 257/E29.329, E29.332, E29.339, E21.003, 257/E21.053; 438/979, 983
See application file for complete search history.

(56) References Cited

U.S. PATENT DOCUMENTS

| | | | |
|---|---|---|---|
| 4,353,081 A | 10/1982 | Allyn et al. | |
| 4,390,889 A | 6/1983 | Capasso et al. | |
| 6,175,143 B1 | 1/2001 | Fujihira et al. | |
| 6,307,244 B1 | 10/2001 | Shikata | |
| 6,316,342 B1 | 11/2001 | Schmitz et al. | |
| 6,380,552 B2 | 4/2002 | Schmitz et al. | |
| 6,624,490 B2 | 9/2003 | Flatte et al. | |
| 6,635,907 B1 * | 10/2003 | Nguyen et al. | 257/183 |
| 6,653,707 B1 | 11/2003 | Sawdai et al. | |
| 6,734,464 B2 | 5/2004 | Sekine | |
| 6,831,309 B2 | 12/2004 | Giboney | |
| 7,138,668 B2 | 11/2006 | Hayashi et al. | |
| 7,795,640 B2 * | 9/2010 | Klipstein | 257/188 |
| 2002/0000564 A1 * | 1/2002 | Schmitz et al. | 257/109 |
| 2004/0075114 A1 | 4/2004 | Sawdai et al. | |
| 2007/0252172 A1 | 11/2007 | Hayashi et al. | |
| 2010/0248676 A1 * | 9/2010 | Takahashi | 455/341 |

OTHER PUBLICATIONS

M.A. Kinch; Fundamentals of Infrared Detector Materials; Chapter 3, IR Detector Materials: A Technology Comparison; 2007; Downloaded from SPEI Digital Library on Apr. 11, 2011.
Chandra, A. et al; Rectification At n-n GaAs: (Ga, Al) As Heterojunctions; Electronics Letters, IEE Stevenage, GB, vol. 15, No. 3; Feb. 1, 1979; XP001289426; ISSN: 0013-5194.

* cited by examiner

*Primary Examiner* — Eduardo A Rodela
(74) *Attorney, Agent, or Firm* — Carmen Patti Law Group, LLC (57) ABSTRACT

A unipolar diode with low turn-on voltage includes a subcathode semiconductor layer, a low-doped, wide bandgap cathode semiconductor layer, and a high-doped, narrow bandgap anode semiconductor layer. A junction between the cathode layer and the anode layer creates an electron barrier in the conduction band, with the barrier configured to produce a low turn-on voltage for the diode. A unipolar diode with low turn-on voltage includes an n⁺ subcathode semiconductor layer, a low-doped, wide bandgap cathode semiconductor layer, and an n⁺ narrow bandgap anode semiconductor layer. Again, a junction between the cathode layer and the anode layer creates an electron barrier in the conduction band, with the barrier configured to produce a low turn-on voltage for the diode.

22 Claims, 7 Drawing Sheets

UNIPOLAR DIODE WITH LOW TURN-ON VOLTAGE

BACKGROUND

The invention relates generally to a unipolar diode and more particularly to a unipolar diode with a low turn-on voltage.

Diodes are a fundamental electronic building block. Their ability to restrict current flow to substantially one direction is a critical property relied upon in virtually every electronic circuit manufactured, from the smallest power supply to the largest industrial process controller.

Mixer and detector circuits use non-linearity in the diode turn-on characteristics to up-convert or down-convert RF signals to either intermediate signals or baseband. To operate, the voltage on the diode must be in the range of its turn-on voltage. This can be accomplished either by biasing the diode with a DC power supply or by providing sufficient radio frequency (RF) or local oscillator (LO) power to self-bias the diode. Introducing bias circuitry to bias the diode increases noise, increases circuit size, increases circuit DC power consumption, increases the conversion loss of the circuit, and decreases the frequency performance of the circuit, so self-biasing is preferred. In order to minimize the required RF or LO power to self-bias the diode, minimizing diode turn-on voltage is desirable.

The capacitance associated with the charge variation in a diode's depletion layer is the junction capacitance. It is generally desirable to minimize a diode's junction capacitance. The barrier height of a diode refers to the potential barrier that must be overcome to turn on the diode.

SUMMARY

In one set of embodiments, there is provided a unipolar diode with low turn-on voltage comprising a subcathode semiconductor layer, a low-doped, wide bandgap cathode semiconductor layer, and a high-doped, narrow bandgap anode semiconductor layer, wherein a junction between the cathode layer and the anode layer creates an electron barrier in the conduction band, with the barrier configured to produce a low turn-on voltage for the diode.

In another set of embodiments, there is provided a unipolar diode with low turn-on voltage comprising an $n^+$ subcathode semiconductor layer, a low-doped, wide bandgap cathode semiconductor layer fabricated on the subcathode layer, and an $n^+$ narrow bandgap anode semiconductor layer fabricated on the cathode layer, wherein a junction between the cathode layer and the anode layer creates an electron barrier in the conduction band, with the barrier configured to produce a low turn-on voltage for the diode.

In yet another set of embodiments, there is provided a method for fabricating a unipolar diode with low turn-on voltage comprising: creating a subcathode semiconductor layer on a substrate; creating a low-doped, wide bandgap cathode semiconductor layer on the subcathode layer; creating a high-doped, narrow bandgap anode semiconductor layer on the cathode layer; removing a portion of the anode layer to expose the cathode layer; removing a second portion of the cathode layer to expose the subcathode layer; placing a metal cathode contact on the subcathode layer; depositing a dielectric layer; removing portions of the dielectric layer to expose the anode layer and the metal cathode contact; placing a metal anode contact on the anode layer; forming a first metal interconnect on the cathode contact; forming a second metal interconnect on the anode contact, wherein a junction between the cathode layer and the anode layer creates an electron barrier in the conduction band, with the barrier configured to produce a low turn-on voltage for the diode.

DESCRIPTION OF THE DRAWINGS

The accompanying drawings provide visual representations which will be used to more fully describe various representative embodiments and can be used by those skilled in the art to better understand the representative embodiments disclosed herein and their advantages. In these drawings, like reference numerals identify corresponding elements.

DETAILED DESCRIPTION

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

Embodiments of the disclosed invention include a unipolar diode with a low turn-on voltage. According to embodiments of the invention, it may be fabricated from an epitaxial stack comprising a subcathode semiconductor layer, a low-doped, wide bandgap cathode semiconductor layer, and a high-doped, narrow bandgap anode semiconductor layer. The anode layer may be placed on the cathode layer, which may in turn be placed on the subcathode layer. Alternatively, the subcathode layer may be placed on the cathode layer, which may in turn be placed on the anode layer.

According to embodiments of the invention, the diode may be fabricated by etching down to the subcathode around an anode/cathode mesa. Following this step, a metal anode contact may be placed on the anode layer and a metal cathode contact may be placed on the subcathode layer. A small, tunable, extremely high quality electron barrier is thereby created in the conduction band, resulting in a low turn-on voltage. This barrier has blocking characteristics that resemble those of the barrier between metal and semiconductor in a Schottky diode.

According to embodiments of the invention, diodes with low turn-on voltages may be created sequentially via epitaxial growth and much simpler device fabrication processes than Schottky diodes. For example, the layers may be created using molecular beam epitaxy (MBE). For example, the layers may be created using metal-organic chemical vapor deposition (MOCVD). Layers may be created in a single semiconductor epitaxial growth reactor, substantially reducing junction contamination, facilitating manufacture, and greatly reducing junction capacitance. Junction capacitance according to embodiments of the invention will typically be less than approximately ten femtofarads (10 fF), compared to a typical junction capacitance for a prior art backward tunneling diode of approximately 70 fF or more. Embodiments of the invention provide diodes that may operate faster relative to prior art backward tunneling diodes.

Embodiments of the invention reduce the turn-on voltage of the diode, thereby reducing the RF or LO power required to turn on a mixer or detector circuit that uses diodes in a self-biased configuration. A reduction in RF power improves the circuit's sensitivity, and a reduction in LO power improves the circuit's efficiency and/or conversion loss.

According to embodiments of the invention, a unipolar diode may be fabricated from an epitaxial stack comprising an $n^+$ narrow bandgap anode semiconductor layer on a low-doped, wide bandgap cathode semiconductor layer on an $n^+$ subcathode semiconductor layer. The diode may be fabricated by etching down to the subcathode layer around an anode/cathode mesa. Then a metal anode contact may be placed on the anode layer and a metal cathode contact may be placed on the subcathode layer.

According to embodiments of the invention, the junction between the anode layer and the cathode layer creates a small, high quality electron barrier in the conduction band. This barrier creates current rectification with a low turn-on voltage. The barrier height can be tuned, according to embodiments of the invention, to any level appropriate for a particular application by varying the composition of the anode and cathode layers. For example, according to embodiments of the invention, the barrier height can be tuned by varying a composition ratio describing the relative presence of gallium (Ga) and aluminum (Al) fractions used in the cathode and anode layers. By varying the composition of the cathode and anode layers according to embodiments of the invention, the alignment of the conduction bands of the cathode and anode layers can be varied, and thereby the height of the barrier can be tuned.

According to embodiments of the invention, an $n^+$ narrow bandgap anode semiconductor layer is used in conjunction with a low-doped, wide bandgap cathode semiconductor layer. This may create an electron barrier in the conduction band that is similar to the barrier between the metal and the semiconductor in a Schottky diode. The cathode layer may be an intrinsic wide bandgap cathode semiconductor layer. The cathode layer may be a low-doped, non-intrinsic wide bandgap cathode semiconductor layer.

The diode in this invention is unipolar since its electrical characteristics are dominated by only one polarity of free carriers. In the case of the embodiment of this invention with an $n^+$ subcathode semiconductor layer, a low-doped, wide bandgap cathode semiconductor layer fabricated on the subcathode layer, and an $n^+$ narrow bandgap anode semiconductor layer fabricated on the cathode layer, the electrical characteristics of the diode are dominated by electrons. Electrons are the majority carriers in all layers of the diode and provide almost all of the electrical current, while holes are negligibly present. Therefore, this diode has negligible minority carriers and hence negligible minority carrier charge storage. Unipolar diodes are faster compared to comparable bipolar diodes such as PN junction diodes, which have a capacitive delay when switched from the on-state to the off-state due to minority carrier charge storage.

Figure 1:
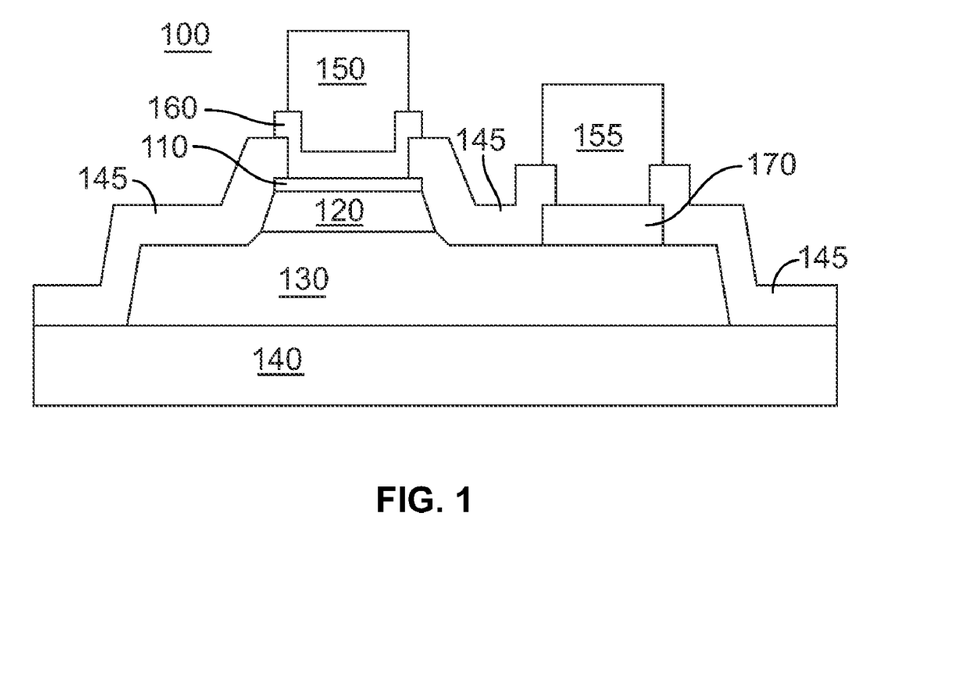
FIG. 1 is a drawing of a cross section of a unipolar diode with low turn-on voltage.

FIG. 1 is a drawing of a cross section of a unipolar diode 100 with a low turn-on voltage. The unipolar diode 100 comprises a high-doped, narrow bandgap anode semiconductor layer 110, a low-doped, wide bandgap cathode semiconductor layer 120, and a subcathode semiconductor layer 130. The diode is fabricated on a semi-insulating substrate 140.

The diode 100 is fully sealed in that the semiconductor materials forming the diode 100 are covered or fully surrounded by metal or dielectric layers.

Depending upon a particular application and need, the size and shape of the diode 100 can be selected from a range of options. Depending upon a particular application and need, the size and shape of the interface of the anode layer 110 with the cathode layer 120 is formed according to one of numerous exemplary configurations including the following:

A=10 $\mu m^2$: 0.5×20, 1×10, 2×5, 3×3.33
A=4 $\mu m^2$: 0.5×8, 0.8×5, 1×4, 2×2
A=2 $\mu m^2$: 0.5×4, 1×2
A=1 $\mu m^2$: 0.5×2, 0.8×1.2, 1×1

As an example, the anode layer 110 may comprise a grown epitaxial Indium Gallium Arsenide (InGaAs) layer. As an example, the cathode layer 120 may comprise a grown epitaxial Indium Aluminum Arsenide (InAlAs) layer. As an example, the subcathode layer 130 may comprise a grown epitaxial Indium Aluminum Arsenide (InAlAs) layer, and etched to form the desired shape for supporting the cathode layer 120. Alternatively, the subcathode layer 130 may comprise a grown epitaxial Indium Aluminum Arsenide (InAlAs) sub-layer (not shown) and a grown epitaxial Indium Gallium Arsenide (InGaAs) sub-layer (not shown). As an example, the substrate 140 may comprise a semi-insulating Indium Phosphide (InP) wafer.

A dielectric layer 145 provides isolation when required between the structure of the diode 100 and, for example, a first metal interconnect 150 and a second metal interconnect 155. The anode connection is, in this example, provided by first metal interconnect 150 through metal ohmic anode contact 160, which contacts and is supported by anode layer 110. A cathode connection is provided by the second metal interconnect 155 through metal ohmic cathode contact 170, which contacts and is supported by subcathode layer 130.

FIGS. 2A-2D are a set of drawings showing a method for fabricating a unipolar diode 100 with low turn-on voltage. In this example, the diode 100 is fabricated by epitaxially growing a subcathode layer 130, then growing a cathode layer 120 on the subcathode layer 130, then growing an anode layer 110 on the cathode layer 120. Next the fabrication entails etching down to the subcathode layer 130 around a mesa comprising cathode layer 120 and anode layer 110. Following this step, a metal anode contact 160 is placed on the anode layer and a metal cathode contact 170 is placed on the subcathode layer.

Figure 2A:
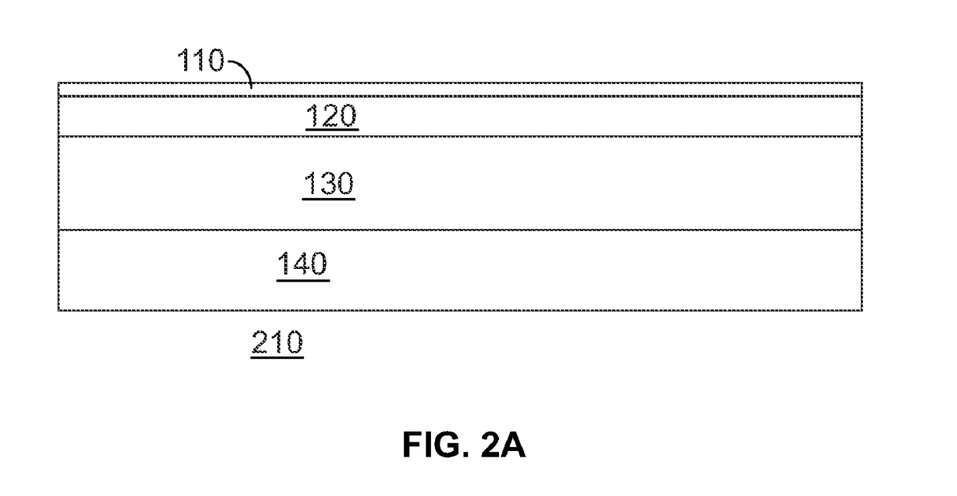
FIGS. 2A-2D are a set of drawings showing a method for fabricating a unipolar diode with low turn-on voltage.

In FIG. 2A, a starting cross section 210 results from epitaxially growing on a substrate, for example, a semi-insulating indium phosphide (InP) wafer 140, a subcathode semiconductor layer 130, then epitaxially growing a low-doped, wide bandgap cathode semiconductor layer 120, then epitaxially growing a high-doped, narrow bandgap anode semiconductor layer 110. For example, the layers may be created using molecular beam epitaxy (MBE). For example, the layers may be created using metal-organic chemical vapor deposition (MOCVD). The semiconductor material may comprise, for example, various compositions of Indium Aluminum Gallium Arsenide (InAlGaAs) or, for another example, Aluminum Gallium Arsenide (AlGaAs).

Figure 2B:
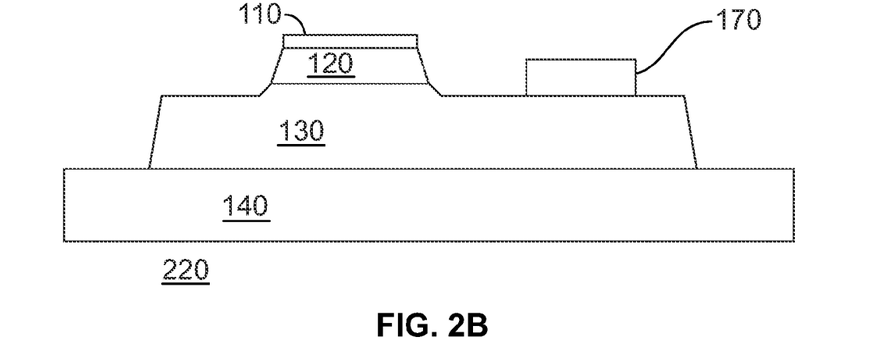

In FIG. 2B, the cross section 220 shows the result of the next fabrication steps. Etching to the desired shape is carried out for subcathode layer 130, for cathode layer 120, and for anode layer 110. Ohmic metal cathode contact 170 is then deposited so that it is supported by subcathode semiconductor layer 130.

Figure 2C:
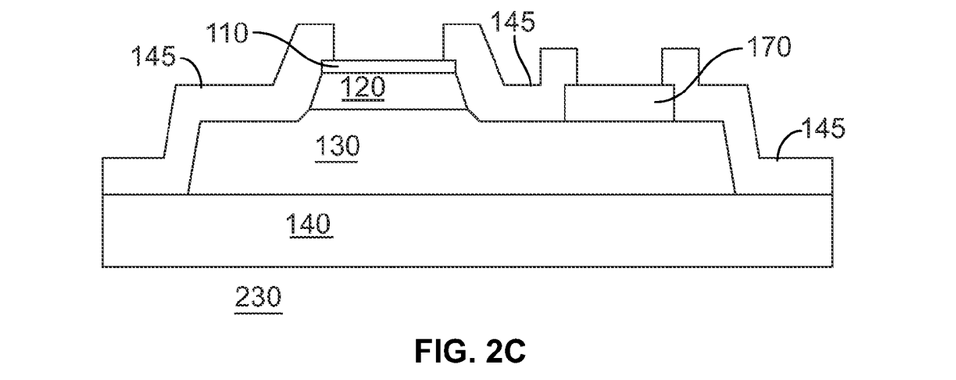

In FIG. 2C, the cross section 230 shows the result of the next fabrication step, in which dielectric layer 145 is deposited. For example, the dielectric layer 145 may comprise silicon nitride (SiN). Portions of the dielectric layer 145 are then removed to reveal contact locations to the underlying layers.

Figure 2D:
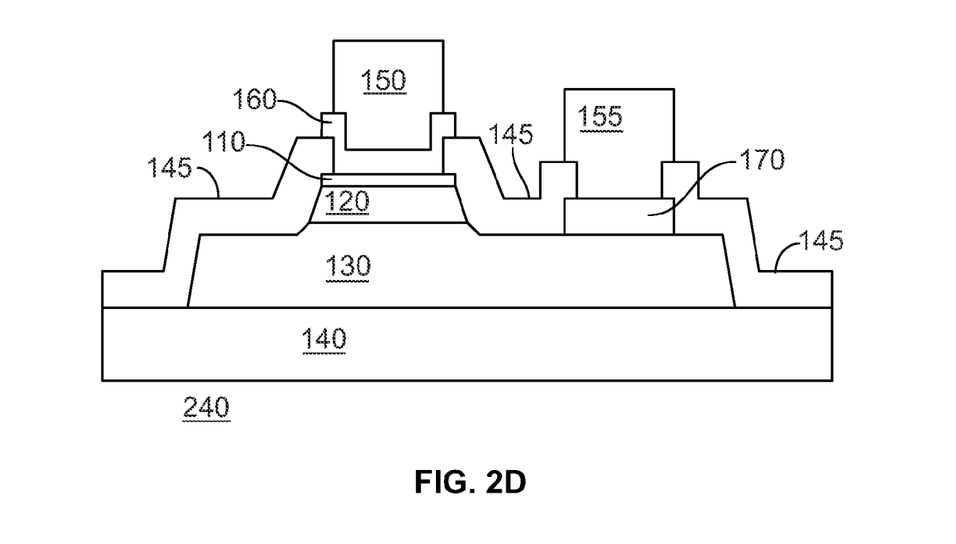

In FIG. 2D, the cross section 240 shows the result of the final fabrication steps. Ohmic metal anode contact 160 is deposited, for example, by electron beam evaporation. Then first metal interconnect 150 is formed on metal ohmic anode contact 160, for example, by electron beam evaporation. A second metal interconnect 155 is formed on metal ohmic cathode contact 170, for example, by electron beam evaporation. Second metal interconnect 155 thereby connects to ohmic cathode contact 170 and seals dielectric layer 145. The cross section 240 illustrates the deposited first metal interconnect 150 and the deposited second metal interconnect 155.

Figure 3A:
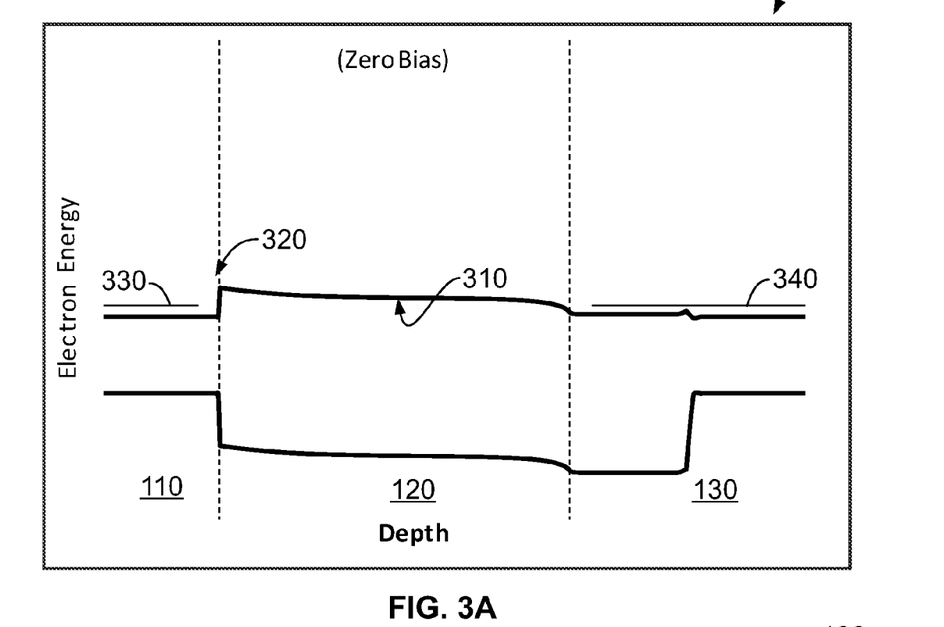
FIGS. 3A-3C are a set of energy band diagrams illustrating the operation of a method for fabricating a unipolar diode with low turn-on voltage in the cases of zero bias, positive bias, and negative bias.

FIG. 3A is an energy band diagram illustrating the operation of a method for fabricating a unipolar diode with low turn-on voltage in the case of zero bias, according to embodiments of the invention comprising an n$^+$ subcathode semiconductor layer, a low-doped, wide bandgap cathode semiconductor layer fabricated on the subcathode layer, and an n$^+$ narrow bandgap anode semiconductor layer fabricated on the cathode layer.

The junction between the low-doped, wide bandgap cathode semiconductor layer and the high-doped, narrow bandgap anode semiconductor layer creates a barrier in the conduction band, with the barrier configured to produce a diode with a low turn-on voltage.

FIG. 3A depicts an energy band diagram of the semiconductor layers of the diode at zero bias according to this set of embodiments. The energy band diagram schematically plots electron energy as a function of depth in the diode 100, which comprises n$^+$ subcathode semiconductor layer 130, a low-doped, wide bandgap cathode semiconductor layer 120 fabricated on the subcathode layer 130, and n$^+$ narrow bandgap anode semiconductor layer 110 fabricated on the cathode layer 120.

A conduction band 310 is created in the diode 100. A discontinuity in the conduction band 310 at the junction between the n$^+$ narrow bandgap anode semiconductor layer 110 and the wide bandgap cathode semiconductor layer 120 creates a conduction band barrier 320.

Line 330 indicates the quasi-Fermi energy level $E_{F\text{-}anode}$ in the n$^+$ anode semiconductor layer 110. Line 340 indicates the quasi-Fermi energy level $E_{F\text{-}subcathode}$ in the n$^+$ subcathode semiconductor layer 130. $E_{F\text{-}anode}$ is approximately equal to the voltage at the metal ohmic anode contact 160 (not shown) of a fully assembled diode 100. Similarly, $E_{F\text{-}subcathode}$ is approximately equal to the voltage at the metal ohmic cathode contact 170 (not shown) of a fully assembled diode 100. For the zero bias case, $E_{F\text{-}anode}$ is approximately equal to $E_{F\text{-}subcathode}$.

Since the quasi-Fermi energy line 330 is located above the conduction band 310 in the n$^+$ anode semiconductor layer 110, and quasi-Fermi energy line 340 is located above the conduction band 310 in the n$^+$ subcathode semiconductor layer 130, both of these semiconductor layers have a large supply of free electrons.

Figure 3B:
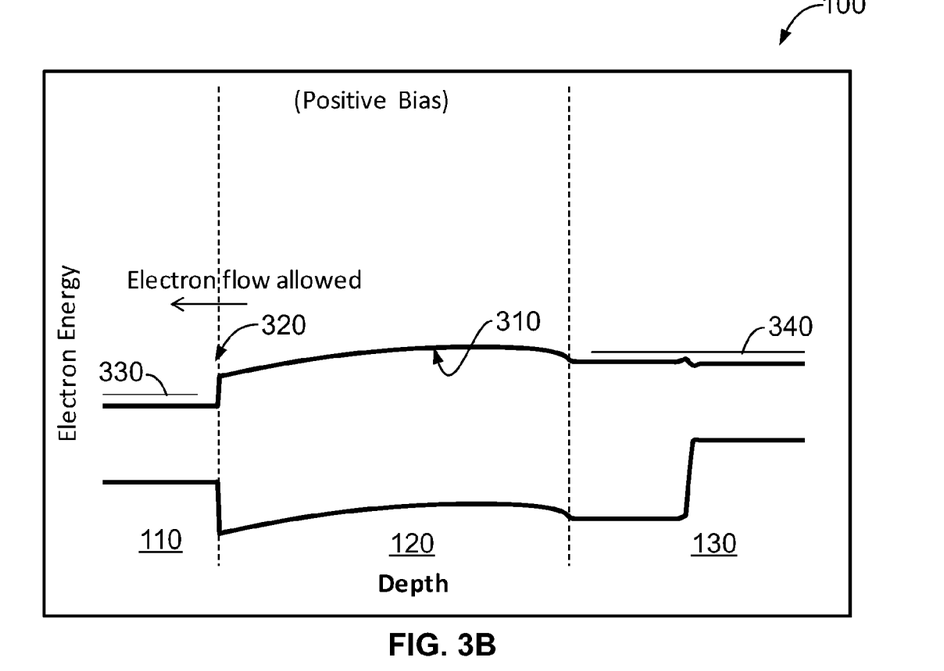

FIG. 3B depicts an energy band diagram of the semiconductor layers of the diode at positive bias according to this same set of embodiments. The energy band diagram again schematically plots electron energy as a function of depth in the diode 100.

A conduction band 310 is again created in the diode 100, with a discontinuity in the conduction band 310 at the junction between the n$^+$ narrow bandgap anode semiconductor layer 110 and the wide bandgap cathode semiconductor layer 120 again creating a conduction band barrier 320.

Line 330 again indicates the quasi-Fermi energy level $E_{F\text{-}anode}$ in the n$^+$ anode semiconductor layer 110, and line 340 again indicates the quasi-Fermi energy level $E_{F\text{-}subcathode}$ in the n$^+$ subcathode semiconductor layer 130. For the positive bias case, $E_{F\text{-}anode}$ is less than $E_{F\text{-}subcathode}$. The positive bias allows electrons to overcome the conduction band barrier 320 and flow from subcathode 130 to anode 110, such that the diode 100 conducts current.

Figure 3C:
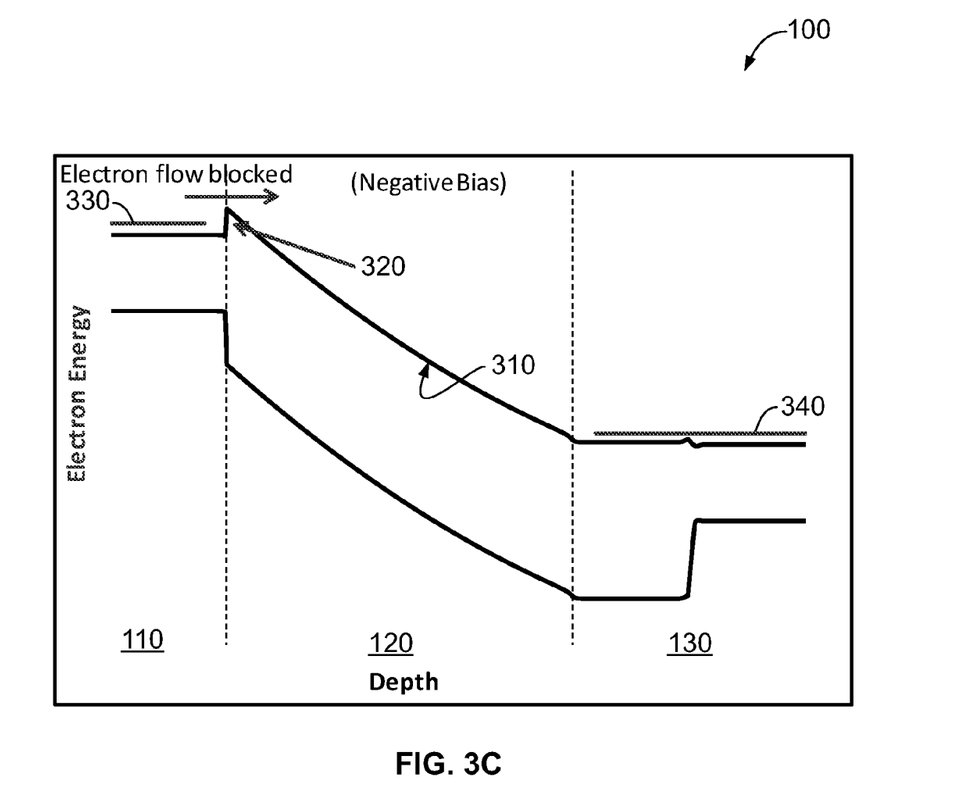

FIG. 3C depicts an energy band diagram of the semiconductor layers of the diode at negative bias according to this same set of embodiments. The energy band diagram again schematically plots electron energy as a function of depth in the diode 100.

A conduction band 310 is again created in the diode 100, with a discontinuity in the conduction band 310 at the junction between the n$^+$ narrow bandgap anode semiconductor layer 110 and the wide bandgap cathode semiconductor layer 120 again creating a conduction band barrier 320.

Line 330 again indicates the quasi-Fermi energy level $E_{F\text{-}anode}$ in the n$^+$ anode semiconductor layer 110, and line 340 again indicates the quasi-Fermi energy level $E_{F\text{-}subcathode}$ in the n$^+$ subcathode semiconductor layer 130. For the negative bias case, $E_{F\text{-}anode}$ is greater than $E_{F\text{-}subcathode}$. The negative bias creates conduction band barrier 320, which prevents electrons from flowing from the anode 110 to the subcathode 130, so that the diode 100 does not conduct appreciable current.

Accordingly, the basic operation of the diode according to embodiments of this invention is similar to the basic operation of a typical Schottky diode. According to embodiments of the invention, the metal-semiconductor barrier of a typical Schottky diode is replaced by a semiconductor-semiconductor conduction band barrier operating according to principles outlined in FIGS. 3A-3C.

Figure 4A:
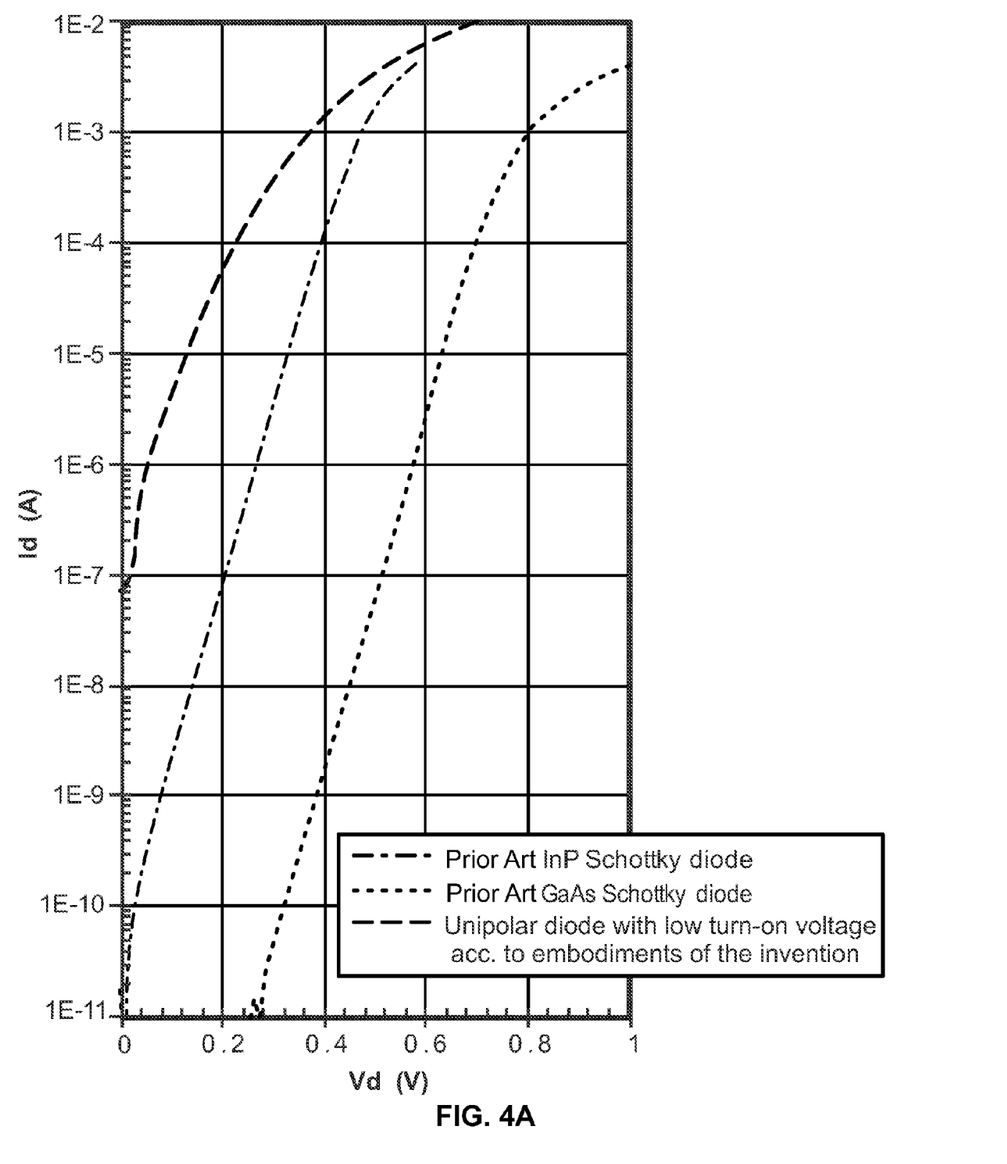
FIG. 4A is a graph showing a plot of current as a function of voltage for a unipolar diode with low turn-on voltage compared to prior-art Schottky diodes.

FIG. 4A is a graph showing a plot of current through the diode as a function of voltage across the diode for a unipolar diode with low turn-on voltage. More specifically, FIG. 4A shows a plot of diode current $I_d$ in amperes as a function of diode voltage $V_d$ in volts, with the current plotted logarithmically against a linear plot of voltage, for three different diodes with a surface area of approximately 9 μm$^2$ (3 μm×3 μm): for a unipolar diode with low turn-on voltage according to embodiments of the invention and for two classes of prior art Schottky diodes, namely, for Indium Phosphide (InP) Schottky diodes and for Gallium Arsenide (GaAs) Schottky diodes.

If we define turn-on voltage as the voltage at which the current is at least 10$^{-6}$ amperes, then embodiments of the invention with a surface area of 9 μm$^2$ have a turn-on voltage of less than approximately 0.2 volts. Other embodiments of the invention with a surface area of approximately 9 μm$^2$ have a turn-on voltage of less than approximately 0.1 volts, by comparison with a turn-on voltage for prior art InP Schottky diodes of greater than approximately 0.25 volts and a turn-on voltage for prior art GaAs Schottky diodes of more than approximately 0.5 volts.

The barrier height of the diode may be tuned by appropriately changing the material and alloy composition of the cathode and anode layers that make up the junction. In one set of embodiments, the barrier height of the diode may be tuned by appropriately changing the relative presence in the cathode and anode layers of aluminum (Al) and of gallium (Ga). Prior art backward tunneling diodes do not typically have a tunable barrier. Prior art Schottky diodes typically are difficult to tune due to surface states caused by contamination or material imperfections at its metal-semiconductor junction.

Figure 4B:
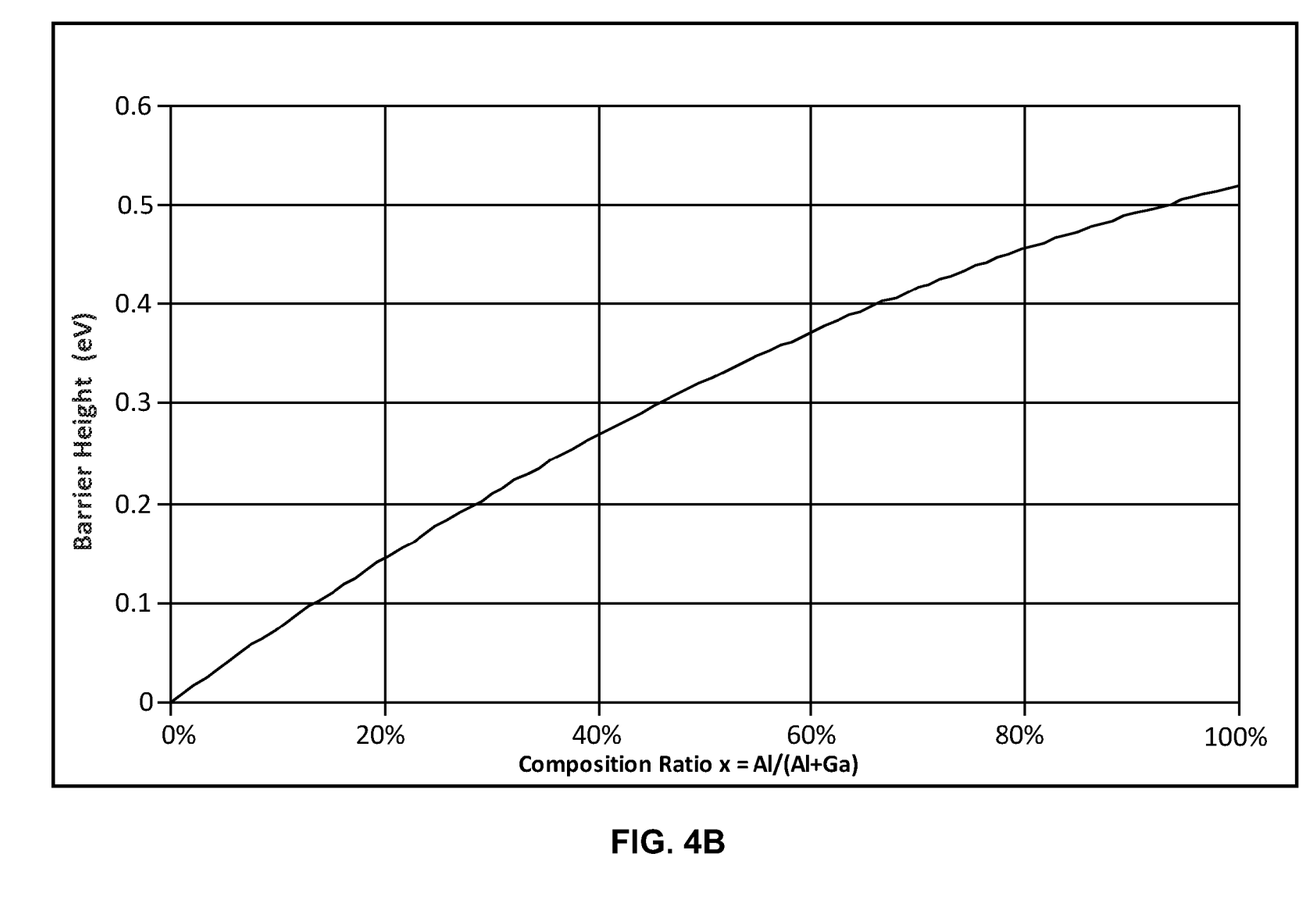
FIG. 4B is a graph showing a plot of conduction band barrier height as a function of diode composition for a unipolar diode with low turn-on voltage.

FIG. 4B is a graph showing a plot of conduction band barrier height as a function of diode composition for a unipolar diode with low turn-on voltage. More specifically, FIG. 4B shows a plot of conduction band barrier height in electron volts (eV) as a function of composition ratio x, with the barrier height plotted linearly against a linear plot of composition ratio x, for a unipolar diode with low turn-on voltage with a surface area of approximately 4 $\mu m^2$ (2 $\mu m \times 2$ $\mu m$) and an anode composed of InGaAs and a cathode composed of InAlGaAs, both materials which are lattice-matched to InP. Composition ratio x is defined as the ratio in the cathode layer of the number of aluminum (Al) atoms to the total number of atoms of aluminum (Al) and gallium (Ga). x=Al/(Al+Ga). When x=0, there results a cathode comprising InGaAs, and when x=1, there results a cathode comprising InAlAs. The greater the value of x, the greater the presence of aluminum, and the higher the barrier height. Tunability is evident from the inflection of the plot of barrier height against composition ratio.

As shown by FIGS. 4A and 4B, embodiments of the invention behave as if they were Schottky diodes with a very small tunable Schottky barrier.

The semiconductor and metal layers that comprise a Schottky diode may be fabricated in different steps, so that the interface between them contains a significant density of contaminants and defects. This contamination creates surface states that cause significant difficulty in reproducing and controlling the diode barrier height and diode leakage current, and hence its electrical characteristics.

Embodiments of the invention use a fixed-composition barrier that may offer greater design flexibility relative to prior art. According to embodiments of the invention, layers of a unipolar diode with low turn-on voltage may be created in a single semiconductor epitaxial growth reactor. This fabrication method significantly reduces junction contamination. The resulting diode can be manufactured very repeatedly. Relative to prior art conventional Schottky diodes, the epitaxial growth process and device fabrication process according to embodiments of this invention is much simpler.

Furthermore, junction capacitance according to embodiments of the invention will typically be less than approximately ten femtofarads (10 fF), compared to a typical junction capacitance for a prior art backward tunneling diode of 70 fF or more.

Figure 5:
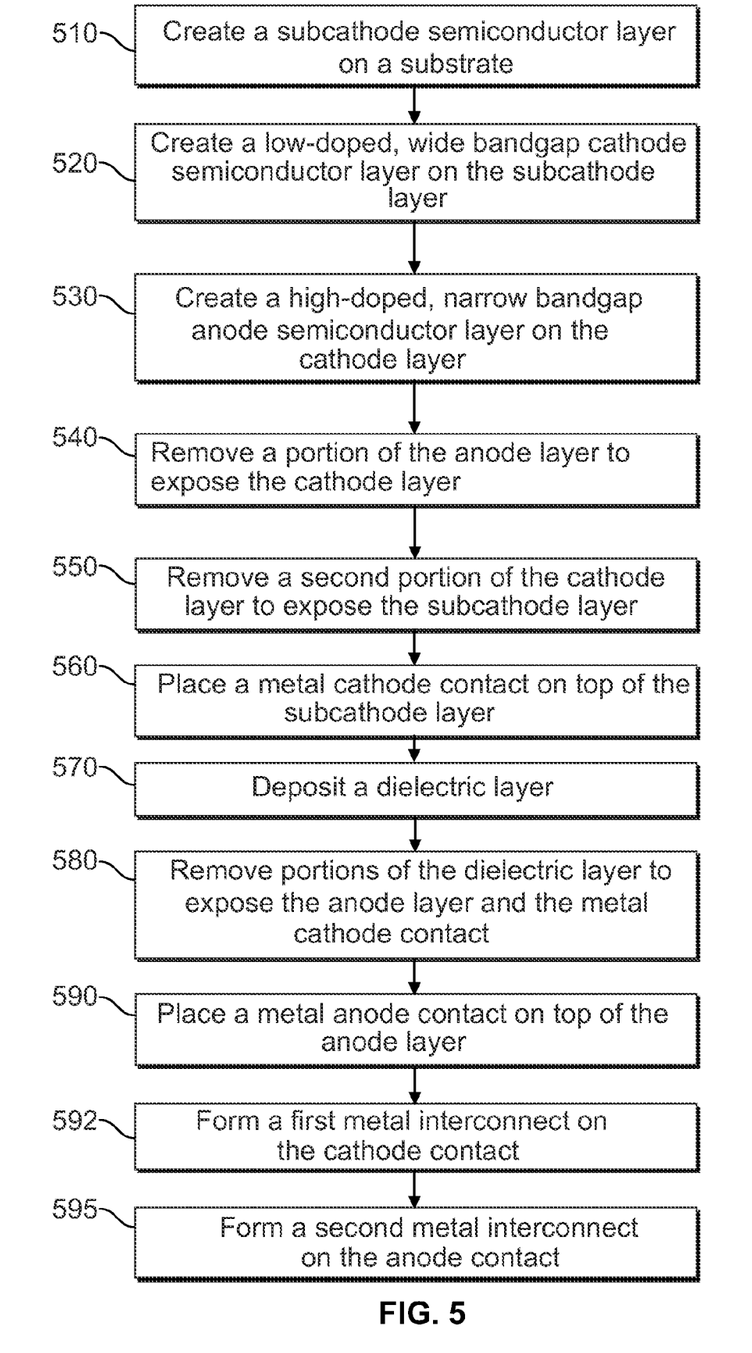
FIG. 5 is a flowchart of a method for fabricating a unipolar diode with low turn-on voltage.

FIG. 5 is a flowchart of a method 500 for fabricating a unipolar diode with low turn-on voltage. The order of the steps in the method 500 is not constrained to that shown in FIG. 5 or described in the following discussion. Several of the steps could occur in a different order without affecting the final result.

In block 510, a subcathode semiconductor layer is created on a substrate. Block 510 then transfers control to block 520.

In block 520, a low-doped, wide bandgap cathode semiconductor layer is created on the subcathode layer. Block 520 then transfers control to block 530.

In block 530, a high-doped, narrow bandgap anode semiconductor layer is created on the cathode layer. Block 530 then transfers control to block 540.

In block 540, a portion of the anode layer is removed to expose the cathode layer. Block 540 then transfers control to block 550.

In block 550, a second portion of the cathode layer is removed to expose the subcathode layer. Block 550 then transfers control to block 560.

In block 560, a metal cathode contact is placed on top of the subcathode layer. Block 560 then transfers control to block 570.

In block 570, a dielectric layer is deposited. Block 570 then transfers control to block 580.

In block 580, portions of the dielectric layer are removed to expose the anode layer and the metal cathode contact. Block 580 then transfers control to block 590.

In block 590, a metal anode contact is placed on the anode layer. Block 590 then transfers control to block 592.

In block 592, a first metal interconnect is formed on the cathode contact to allow for connections to the diode. Block 592 then transfers control to block 595.

In block 595, a second metal interconnect is formed on the anode contact to allow for connections to the diode. As a result, a junction creates an electron barrier in the conduction band, with the barrier configured to produce a low diode turn-on voltage. Block 595 then terminates the process.

Alternatively, embodiments of the invention may comprise a $p^+$ narrow bandgap cathode semiconductor layer, a wide bandgap anode semiconductor layer, and a $p^+$ subanode semiconductor layer. According to this set of embodiments, a hole barrier is created in the valence band, instead of an electron barrier in the conduction band. The operation and advantages of this alternative set of embodiments are comparable to the operation and advantages of the sets of embodiments described above.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain fabrication steps and certain components can be altered without substantially impairing the functioning of the invention.

For example, the fabrication step of placing a metal anode contact could instead entail providing one of a metal anode contact self-aligned to the anode semiconductor layer. As another example, the fabrication step of placing a metal anode contact could additionally provide a cantilever beam to the metal interconnect. As another example, the fabrication step of placing the metal interconnect could additionally provide an airbridge over the subcathode semiconductor region. As another example, the device could comprise the anode layer as the bottom layer, with the subcathode layer as the top layer, and could be fabricated accordingly without substantially impairing the functioning of the invention.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the appended claims. Moreover, fabrication details are merely exemplary; the invention is defined by the following claims.

We claim:

1. A unipolar diode with low turn-on voltage, comprising:
   a subcathode semiconductor layer;
   a low-doped, wide bandgap cathode semiconductor layer; and
   a high-doped, narrow bandgap anode semiconductor layer,
      wherein a junction between the cathode layer and the anode layer creates an electron barrier in the conduction band, with the barrier configured to produce a low turn-on voltage for the diode.

2. The diode of claim 1 wherein:
the electron barrier can be tuned.

3. The diode of claim 1 wherein:
the electron barrier can be tuned by appropriately choosing the composition of at least one of the materials comprised in at least one of the anode layer and the cathode layer.

4. The diode of claim 3, wherein the materials comprise at least one of gallium and aluminum.

5. The diode of claim 1, wherein the cathode layer is an intrinsic wide bandgap cathode semiconductor layer.

6. The diode of claim 1, wherein the cathode layer is a low-doped, non-intrinsic wide bandgap cathode semiconductor layer.

7. The diode of claim 1, wherein the diode has a surface area of approximately 9 $\mu m^2$ and has a turn-on voltage of less than approximately 0.2 volts.

8. The diode of claim 1, wherein the diode has a surface area of approximately 9 $\mu m^2$ and has a turn-on voltage of less than approximately 0.1 volts.

9. The diode of claim 1, wherein the diode has a small junction capacitance.

10. The diode of claim 7, wherein the junction capacitance of the diode is less than approximately ten femtofarads.

11. The diode of claim 1, wherein:
the subcathode layer is an $n^+$ subcathode semiconductor layer.

12. The diode of claim 1, wherein:
the anode layer is a $n^+$ narrow bandgap anode semiconductor layer.

13. The diode of claim 1, wherein:
the subcathode layer is the bottom layer.

14. The diode of claim 1, wherein:
the anode layer is the bottom layer.

15. The diode of claim 1, wherein:
the diode is fabricated from an epitaxial stack.

16. The diode of claim 1, wherein:
the diode is fabricated from an epitaxial stack comprising:
the anode layer;
the cathode layer; and
the subcathode layer.

17. A unipolar diode with low turn-on voltage, comprising:
An $n^+$ subcathode semiconductor layer;
a low-doped, wide bandgap cathode semiconductor layer fabricated on the subcathode layer; and
an $n^+$ narrow bandgap anode semiconductor layer fabricated on the cathode layer, wherein a junction between the cathode layer and the anode layer creates a barrier in the conduction band, with the barrier configured to produce a low turn-on voltage for the diode.

18. The diode of claim 17 wherein:
the electron barrier can be tuned.

19. The diode of claim 17 wherein:
the electron barrier can be tuned by appropriately choosing the composition of at least one of the materials comprised in at least one of the anode layer and the cathode layer.

20. The diode of claim 17, wherein the materials comprise at least one of gallium and aluminum.

21. A method for fabricating a unipolar diode with low turn-on voltage, comprising:
creating a subcathode semiconductor layer on a substrate;
creating a low-doped, wide bandgap cathode semiconductor layer on the subcathode layer;
creating a high-doped, narrow bandgap anode semiconductor layer on the cathode layer;
removing a portion of the anode layer to expose the cathode layer;
removing a second portion of the cathode layer to expose the subcathode layer;
placing a metal cathode contact on the subcathode layer;
depositing a dielectric layer;
removing portions of the dielectric layer;
placing a metal anode contact on the anode layer;
forming a first metal interconnect on the cathode contact; and
forming a second metal interconnect on the anode contact,
wherein a junction between the cathode layer and the anode layer creates an electron barrier in the conduction band, with the barrier configured to produce a low turn-on voltage for the diode.

22. The method of claim 21, wherein:
at least one of the step of creating the subcathode layer, the step of creating the cathode layer, and the step of creating the anode layer is performed epitaxially.

* * * * *